(12) United States Patent
Kaikkonen et al.

(10) Patent No.: US 9,923,636 B2
(45) Date of Patent: *Mar. 20, 2018

(54) INTERCONNECT STRUCTURE FOR E/O ENGINES HAVING IMPEDANCE COMPENSATION AT THE INTEGRATED CIRCUITS' FRONT END

(71) Applicant: Finisar Corporation, Sunnyvale, CA (US)

(72) Inventors: Andrei Kaikkonen, Jaerfaella (SE); Lennart Lundquist, Jaerfaella (SE); Lars-Goete Svensson, Vallentuna (SE); Robert Smith, Phoenix, AZ (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/403,157

(22) Filed: Jan. 10, 2017

(65) Prior Publication Data

US 2017/0150593 A1 May 25, 2017

Related U.S. Application Data

(63) Continuation of application No. 14/029,201, filed on Sep. 17, 2013, now Pat. No. 9,544,057.

(51) Int. Cl.
*H04B 10/40* (2013.01)
*H05K 1/02* (2006.01)
*G02B 6/42* (2006.01)

(52) U.S. Cl.
CPC .......... *H04B 10/40* (2013.01); *G02B 6/4274* (2013.01); *H05K 1/0213* (2013.01); *H05K 1/0245* (2013.01); *H05K 2201/10121* (2013.01)

(58) Field of Classification Search
CPC .... H04B 10/40; H05K 1/0245; H05K 1/0213; H05K 2201/10121; G02B 6/4274
See application file for complete search history.

(56) References Cited

U.S. PATENT DOCUMENTS

2003/0178657 A1* 9/2003 Nguyen .................. H01L 23/66
257/292
2004/0036169 A1* 2/2004 Higuchi .................. H01L 23/13
257/728

(Continued)

FOREIGN PATENT DOCUMENTS

JP 2013026601 A 2/2013

*Primary Examiner* — David Payne
*Assistant Examiner* — Casey Kretzer
(74) *Attorney, Agent, or Firm* — Maschoff Brennan

(57) ABSTRACT

Disclosed embodiments relate to an interconnect structure for coupling at least one electronic unit for outputting and/or receiving electric signals, and at least one optical unit for converting said electric signals into optical signals and/or vice versa, to a further electronic component. The interconnect structure comprises an electrically insulating substrate and a plurality of signal lead pairs to be coupled between said electronic unit and a front end contact region for electrically contacting said interconnect structure by said further electronic component. A ground plane layer is electrically insulated from said pairs of signal leads, wherein each pair of signal leads has a circuit connecting region for electrically contacting respective terminals of said at least one electronic unit, and wherein in a region adjacent to said terminals of said at least one electronic unit said ground plane layer has a plurality of clearances that are each allocated to one pair of signal leads and separated from a respective neighboring clearance.

20 Claims, 10 Drawing Sheets

(56) References Cited

U.S. PATENT DOCUMENTS

| | | | |
|---|---|---|---|
| 2006/0091545 A1* | 5/2006 | Casher | H05K 1/0219 |
| | | | 257/738 |
| 2006/0210215 A1* | 9/2006 | Aoki | H04B 10/40 |
| | | | 385/14 |
| 2007/0102830 A1 | 5/2007 | Akira et al. | |
| 2010/0095110 A1* | 4/2010 | Noble | H04L 9/0891 |
| | | | 713/153 |

* cited by examiner

INTERCONNECT STRUCTURE FOR E/O ENGINES HAVING IMPEDANCE COMPENSATION AT THE INTEGRATED CIRCUITS' FRONT END

CROSS-REFERENCE TO RELATED APPLICATIONS

This application is a continuation of U.S. patent application Ser. No. 14/029,201, filed Sep. 17, 2013, titled INTERCONNECT STRUCTURE FOR E/O ENGINES HAVING IMPEDANCE COMPENSATION AT THE INTEGRATED CIRCUITS' FRONT END, now U.S. Pat. No. 9,544,057, issued Jan. 10, 2017, which is incorporated herein by reference in its entirety.

FIELD

Disclosed embodiments relate to an interconnect structure for coupling at least one electronic unit, configured to output and/or receive electric signals, and at least one optical unit, configured to convert the electric signals into optical signals and/or vice versa, to another electronic component. In example embodiments, an optoelectronic module including such an interconnect structure, and an active optical cable assembly including at least one such optoelectronic module, are disclosed.

BACKGROUND

In order to support the communication requirements of high-speed data w transmission applications of e.g. 25, 40 or 100 Gbps, optical links are used when links via an electrical wire have a too low bandwidth. When using such an optical link for transmitting a signal from a first electronic component to a second electronic component, the electrical signal to be transmitted is first converted into an optical signal, then the optical signal is coupled into an optical fiber via an optical transmitter and transmitted to the second electronic component via the optical fiber. At the second electronic component, the optical signal is received by means of an optical receiver and converted back into an electrical signal. This converted electrical signal is further processed in the second electronic component.

Optoelectronic components that perform the transduction between the optical and electrical signals are often referred to as transceivers, E/O engines or EOE engines.

As shown in FIG. 1, such a transceiver 100 which is used for converting an electric signal into an optical signal and vice versa, includes an electrically insulating substrate 102, for instance a printed circuit board (PCB) or a flexible printed circuit (FPC). The transceiver 100 further comprises a plurality of signal input lines 104 which are arranged as differential signal pairs and end in a front end contact region for electrically contacting further electronic components, for instance via another printed circuit board.

The other peripheral end of the signal input lines being opposed to the front end contact region 106 is connected to an electronic transmission unit 108 in a circuit connecting region 110. The electronic transmission unit 108 comprises driver circuitry for driving optical senders, for instance an array of vertical cavity surface emitting lasers (VCSEL) 112. The optical signal emitted by the laser diode array 112 is internally coupled to an optical conductor, for instance an optical fiber.

Furthermore, the transceiver unit 100 comprises a photo detector array 114, which comprises for instance photodiodes, such as so-called PIN diodes (p-intrinsic-n photodiodes). These PIN diodes are coupled to the optical fiber for receiving an optical signal and converting same into an electrical signal. The output of the PIN diodes 114 is coupled to an amplifier unit 116, which may comprise an array of transimpedance amplifiers (TIA) connected to respective outputs of the array of photodiodes 114.

A plurality of electrical signal output lines 120 are provided for connecting the front end contact region to the output terminals of the amplifier circuit 116. The signal output lines 120 are formed as differential lines analogously to the signal input lines 104.

A ground plane layer 118 is provided within the substrate 102 with a well-defined distance towards the input and output signal lines 104 and 120, respectively.

The laser diodes 112 and the driver circuit 108 as well as the PIN diodes 114 and the belonging amplifier unit 116 are all placed on the substrate 102 in a way that they are surrounded by the ground plane layer 118. As proposed in the international application PCT/EP2013/063694, the ground plane layer 118 is provided with openings 124 in the region of the front end contact region 106 in order to improve the signal quality at the transition point from the E/O engine 100 to e.g. a further printed circuit board (not shown in the figure).

Due to parasitic effects of the bond pads and ESD protection devices on the chip, the impedances of the front end of the transmission unit 108 as well as the transimpedance amplifier unit 116 exhibit a capacitive nature. Therefore, significant impedance drops in the area of the circuit connection region 110 of the electronic transmission unit 108 and of the amplifier unit 116 are observed. This impairs the performance of the optoelectronic unit and makes it difficult to meet the return loss specification.

The interconnection system preferably carries signals with minimal distortion. One type of distortion is called crosstalk. Crosstalk occurs when one signal creates an unwanted signal on another signal line. Generally, crosstalk is caused by electromagnetic coupling between signal lines and is therefore a particular problem for high-speed, high-density interconnection systems. Electromagnetic coupling increases when signal lines are closer together or when the signals they carry are of a higher frequency. Both of these conditions are present in a high-speed, high-density interconnection system.

FIG. 2 shows the result of a time-domain reflectometry (TDR) measurement at the circuit connecting region 110 obtained with 20 ps (20 to 80%) pulses without any impedance matching measures. It can be seen from FIG. 2 that a significant pulse is reflected back indicating an undesired disturbance in this region.

SUMMARY

Disclosed embodiments increase impedance to an acceptable level in the region of a circuit connecting terminals by introducing clearances into the ground plane layer of an E/O engine substrate. In a disclosed embodiment, this can be done below the terminals of the electronic transmission unit as well as below the terminals of the amplifier unit. By providing such a ground clearance configuration, crosstalk (XT), mode conversion and common mode return loss (CM RL) are not significantly compromised, whereas the impedance can be matched in order to meet the requirements regarding return losses.

In disclosed embodiments, the clearances can be each allocated to one pair of differential signal leads and are separated from one or two neighboring clearances by a ground plane web of exactly defined dimensions. In order to avoid crosstalk, each of the clearances is separated from the next clearance by a web. In a disclosed embodiment, the web has a width of at least 30 µm.

In one embodiment, to provide uniform impedance matching for each of the signal lead pairs, the clearances have a contour that matches the contour of the respectively belonging signal leads.

In one embodiment, a ratio between the distance of each lead of one pair towards the adjacent outer boundary of the clearance, and the distance between both leads can be approximately ½ in order to reach a sufficiently desired high impedance. For instance, each lead can be distanced 50 µm from the respective adjacent outer boundary of the clearance and 100 µm from the other lead of one pair.

In some implementations, length of the clearance of at least 700 µm can be used for reaching sufficiently high impedance.

Some embodiments can be used with an optoelectronic module comprising at least one electronic unit for outputting and/or receiving electric signals and at least one optical unit for converting the electric signals into optical signals and/or vice versa.

As used herein, an optoelectronic module refers in general to a system comprising optoelectronic components for transmitting or receiving an optical signal connected to a driver and/or receiver electronics. Optoelectronic components in the present context are devices arranged to convert electrical energy into optical energy or optical energy into electrical energy, i.e. light sources and photo detectors, such as laser diodes and photo diodes, as mentioned above. Often, the laser diodes are vertical cavity surface emitting lasers (VCSEL) and as photo diodes p-intrinsic-n photo diodes may be used.

Typically, such a module will also comprise an interface allowing the module to be connected to one or more optical fibers as well as control electronics to adjust the operating parameters of the optoelectronic components. For example, the operation of a laser diode typically requires an adjustable bias current, modulations current and optionally a pre-emphasis. Often, such modules will support more than one channel, such as two, four, eight, twelve or sixteen channels, but any number of channels is conceivable depending on the application. For such a use, the light sources and photo detectors are often available in arrays, such as 1×N arrays or 2×N arrays, wherein N is a positive integer. Strictly, a 2×N array is referred to as a matrix, but in order to simplify notation, only the term "array" is used in the following. Furthermore, disclosed embodiments use a 4-channel arrangement in line with the application as a quad small form-factor pluggable (QSFP) E/O engine, but the invention is of course not limited to such an arrangement.

In order to convert an electrical data signal into a signal suitable for driving a light source to emit an optical signal comprising this data signal, a driver circuit is typically used. Similarly, a receiver circuit is used to convert received optical signals into an electrical signal suitable for further transmission in the system. Such driver and receiver circuits are well-known in the art and they are typically provided as integrated circuits either as transmitter chips (comprising driver circuits), receiver chips (comprising receiver circuits) or transceiver chips (comprising a driver and receiver circuit).

A receiver chip is often also referred to as a TIA chip (transimpedance amplifier chip) or an LIA chip (limiting impedance amplifier chip). These chips comprise data pins/pads for receiving/transmitting the electrical data signals to/from a host system and connecting pads for connecting to the optical devices, i.e. connecting pins/pads for connecting to the optical w side of the chip, i.e. light sources or photo detectors.

A disclosed interconnect structure can be used in an active optical cable (AOC) assembly that inputs and outputs electrical signals but conducts same by means of an optical conductor. The active optical cable assembly may be either a direct point-to-point connection or may also be structured as a fan out cable, meaning one input and a plurality of outputs. The active optical cable technology improves speed and distance performance of the cable without sacrificing compatibility with standard electrical interfaces.

BRIEF DESCRIPTION OF THE DRAWINGS

The accompanying drawings are incorporated into and form a part of the specification to illustrate several embodiments of the present invention. These drawings together with the description serve to explain the principles of the invention. The drawings are merely for the purpose of illustrating the preferred and alternative examples of how the invention can be made and used, and are not to be construed as limiting the invention to only the illustrated and described embodiments. Furthermore, several aspects of the embodiments may form individually or in different combinations solutions according to the present invention. Further features and advantages will become apparent from the following more particular description of the various embodiments of the invention, as illustrated in the accompanying drawings, in which like references refer to like elements, and wherein.

DETAILED DESCRIPTION

Figure 3:
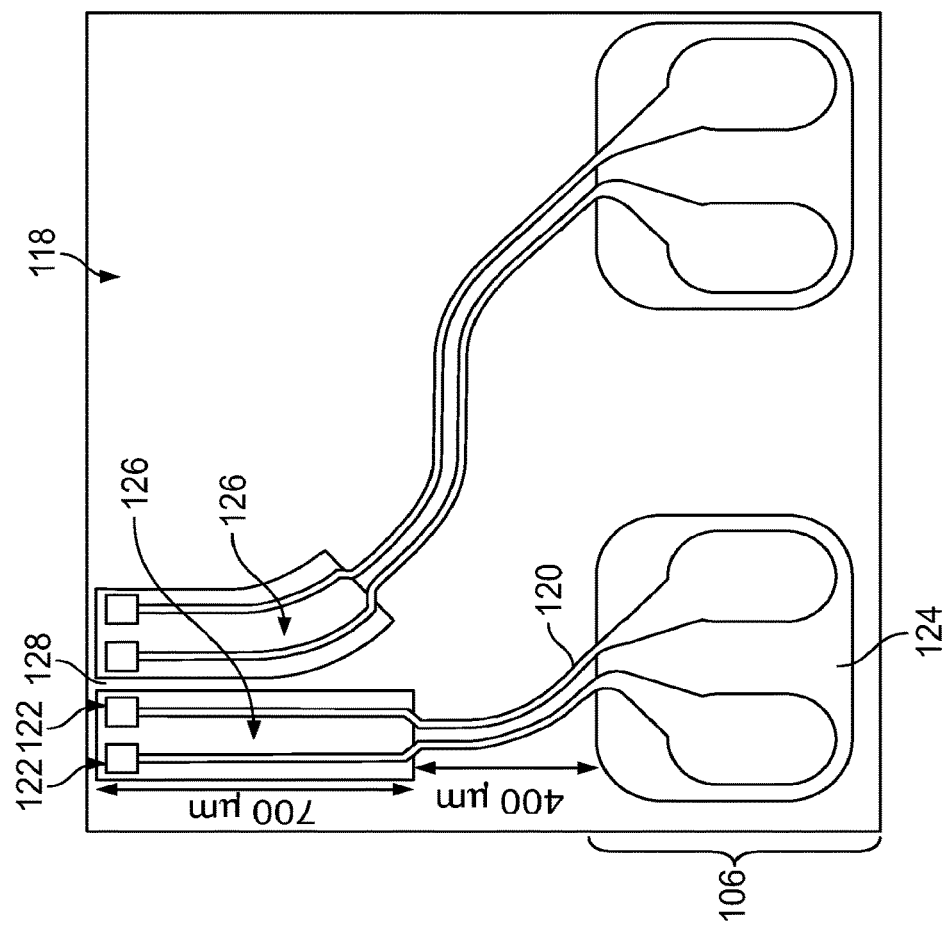
FIG. 3 shows the proposed ground plane layout according to an embodiment of the present invention.

Referring now to FIG. 3, an advantageous embodiment of an electrical connection interface is shown.

Figure 1:
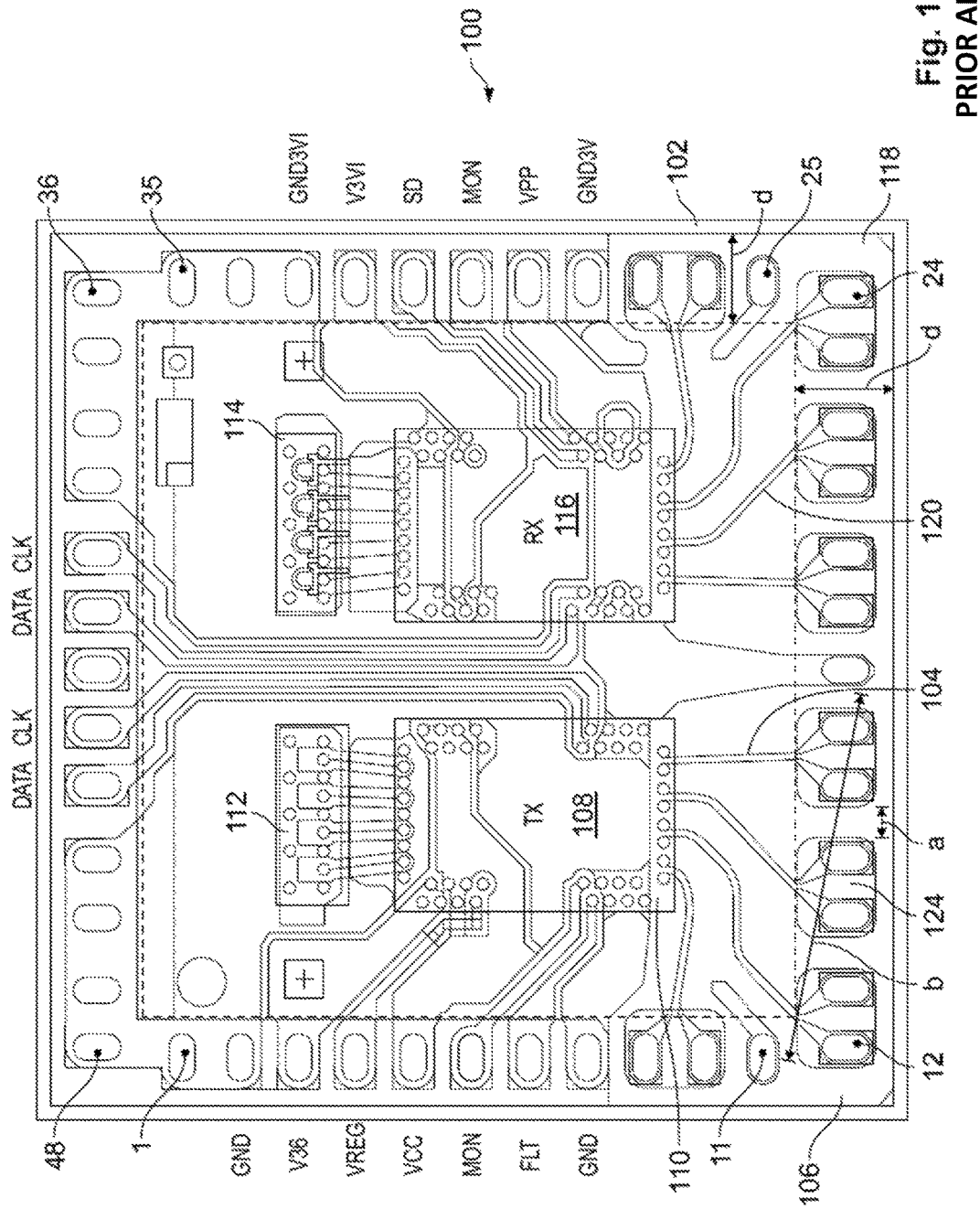
FIG. 1 shows a layout diagram of a 4-channel QSFP E/O engine.
Figure 2:
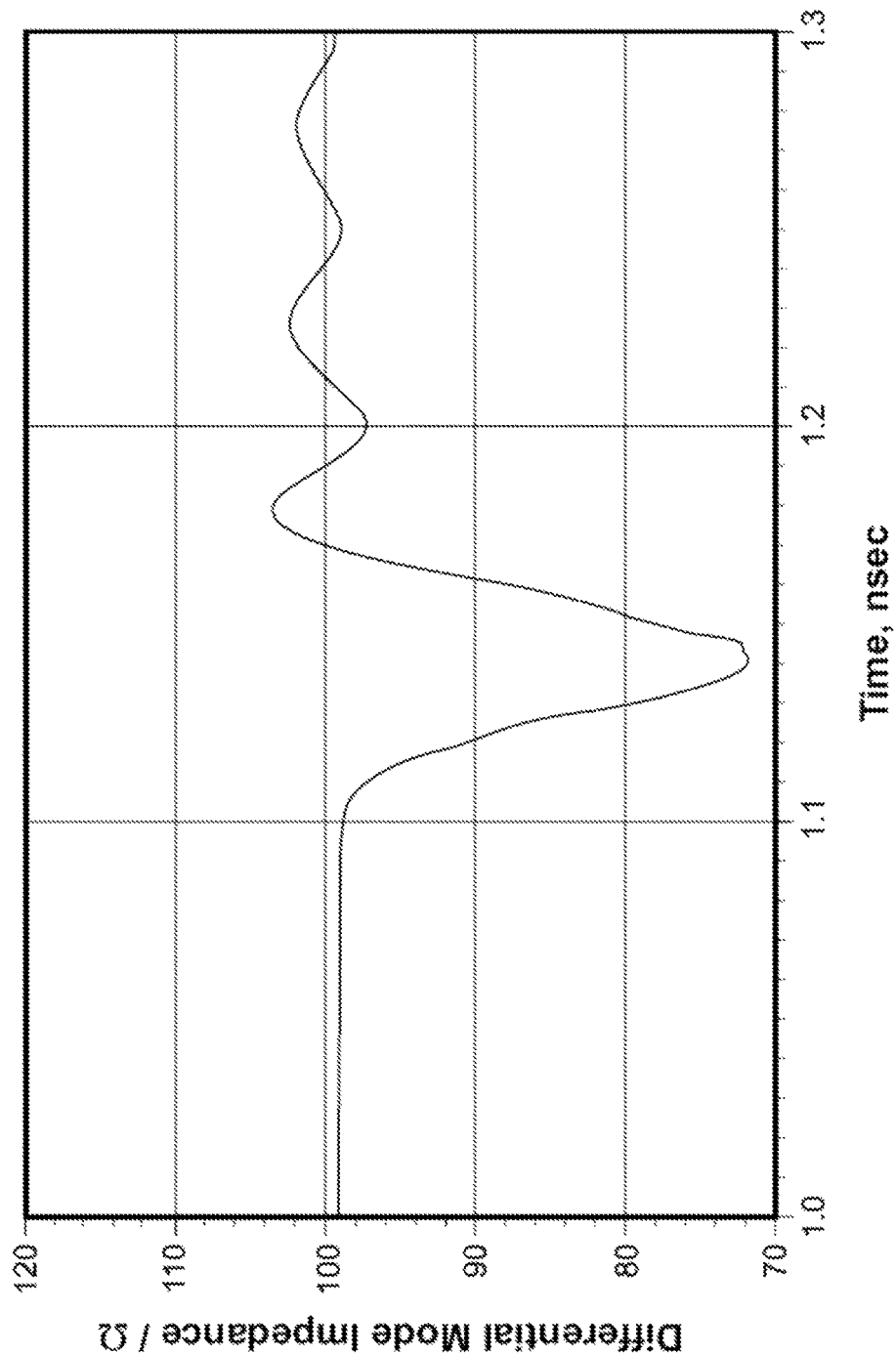
FIG. 2 shows the result of a time-domain reflectometry obtained with 20 ps (20 to 80%) pulses at the TX input area without clearances.

In FIG. 3 only the metallic parts, i.e. the signal leads and the ground plane layer are shown in order to make clear the gist of the invention. However, of course also insulating layers are present and furthermore, the shown metallic layers do not have to be the only electrically conductive layers. Moreover, FIG. 3 only shows a part of the circuit connection region and it is of course clear, that the inventive clearances will advantageously be applied to all of the signal lead pairs 104, 120 shown in FIG. 1.

FIG. 3 exemplarily shows two of the signal output line pairs 120 that lead from the IC terminations 122 connected with the receiver unit 116, towards the front end contact region 106. It has to be mentioned that the drawing is not necessarily to scale.

As already proposed in the international application PCT/EP2013/063694, first clearances 124 are provided around the front end contacts which are connected to for instance a printed circuit board. According to the present invention, the ground plane layer has further clearances 126 in the vicinity of the IC termination bond pads 122. These clearances 122 are allocated to each differential pair of signal leads 120 and follow the leads' layout contour with their own outline. It could be shown that a particularly advantageous dimension for the clearances 126 is a length of at least 700 µm and a width of 230 µm for the present embodiment. Furthermore, a distance of at least 400 µm is kept between the ground clearances 126 and the first clearances 124 arranged in the area of the HF connection to the module printed circuit board transmission lines in the area 106.

Figure 4:
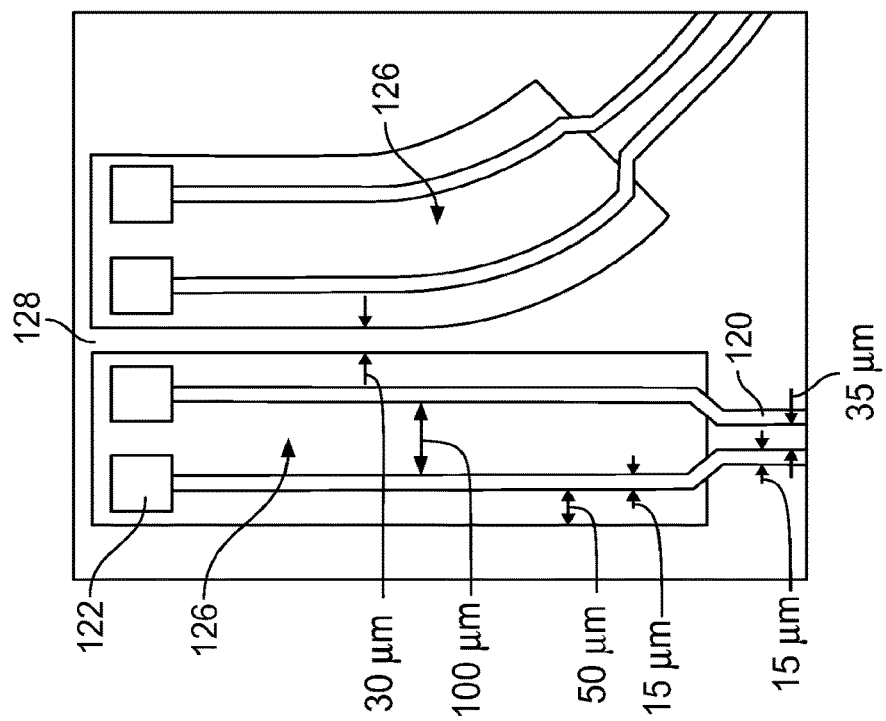
FIG. 4 shows a detail of FIG. 3.

FIG. 4 shows the details of the clearances 126 of FIG. 3. In particular, the metallization of each of the signal lines 120 has a width of 15 µm and the distance between two lines of one differential pair differs between the region where the clearance 126 is provided and where the ground plane layer is uninterrupted. In the region of the clearance 126, the leads of each differential pair are distanced from each other by 100 µm, whereas the separation between the lines in the remaining area is only 35 µm. It could be shown that sufficient impedance compensation at the integrated circuit front end can be achieved by ensuring a gap of at least 50 µm (half of the separation distance) to the ground transmission lines (not shown in the figure). Furthermore, each pair of signal leads has to be separated from the neighboring pair by a ground plane layer web 128 having a width of at least 30 µm.

In a disclosed embodiment, there is sufficient engine ground placed between the neighboring pairs of differential transmission lines and between the clearances 126 and 124 in order to achieve acceptable levels of crosstalk, mode conversion and common mode return loss.

Figure 5:
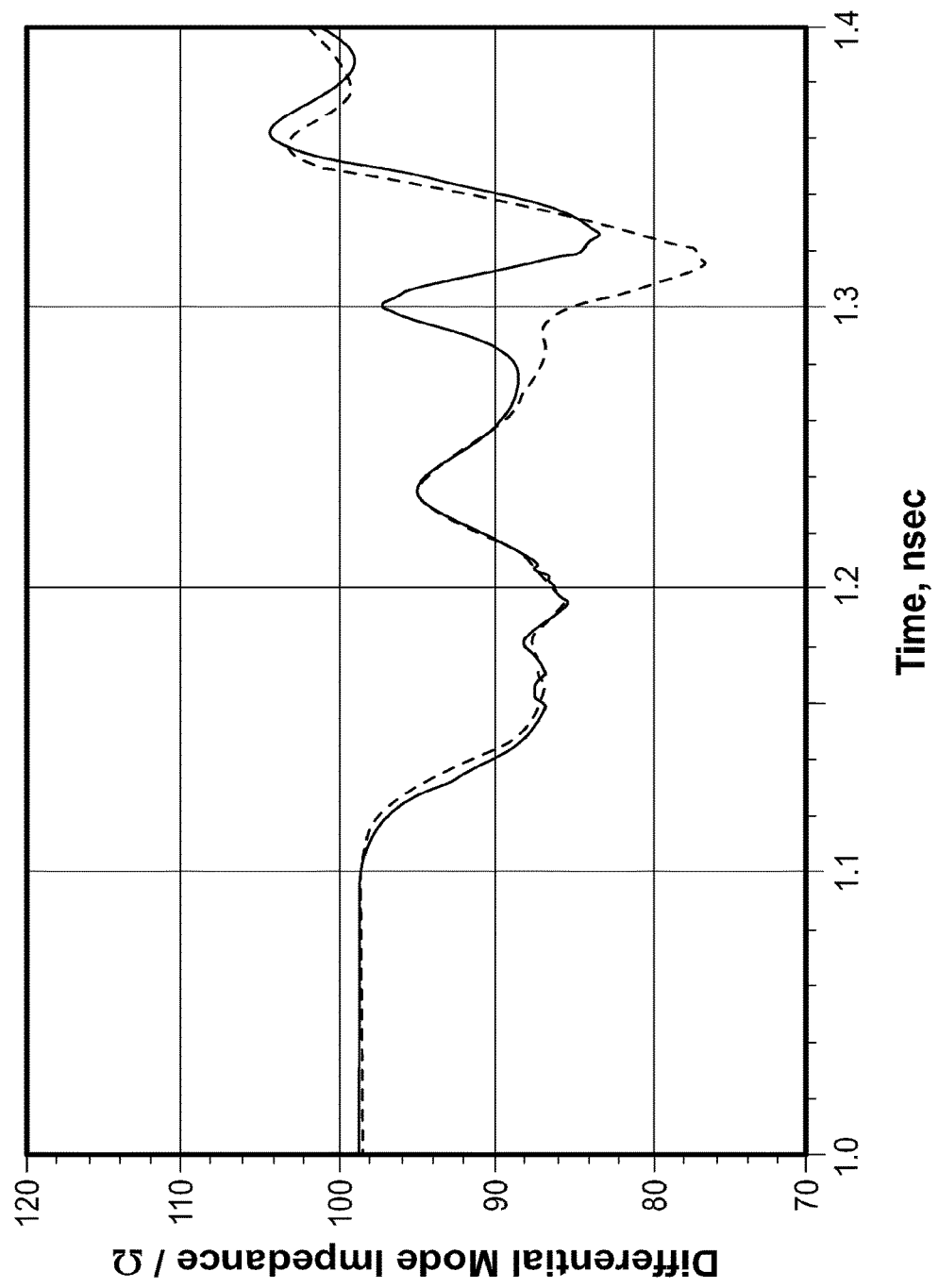
FIG. 5 shows a comparison of the time-domain reflectometry results with and without the inventive ground clearances.

FIG. 5 shows a comparison of the return loss curves measured with a time-domain reflectometry (20 ps (20 to 80%) pulses) for an E/O engine according to the present invention mounted to a printed circuit board, as shown in the international application PCT/EP2013/063694. Return loss is a frequency domain parameter analogous to the time domain impedance profile. Return loss (RL) is defined as the amount of signal energy reflected back towards the source as a result of impedance mismatches in the transmission path. Curve 501 (drawn as a solid line) represents the solution with the inventive IC front end ground clearances, whereas curve 502 (drawn as a broken line) represents the results without the inventive clearances. As can be seen from a comparison of the two curves 501, 502 in particular the distinct peak 503 could be eliminated.

Figure 6:
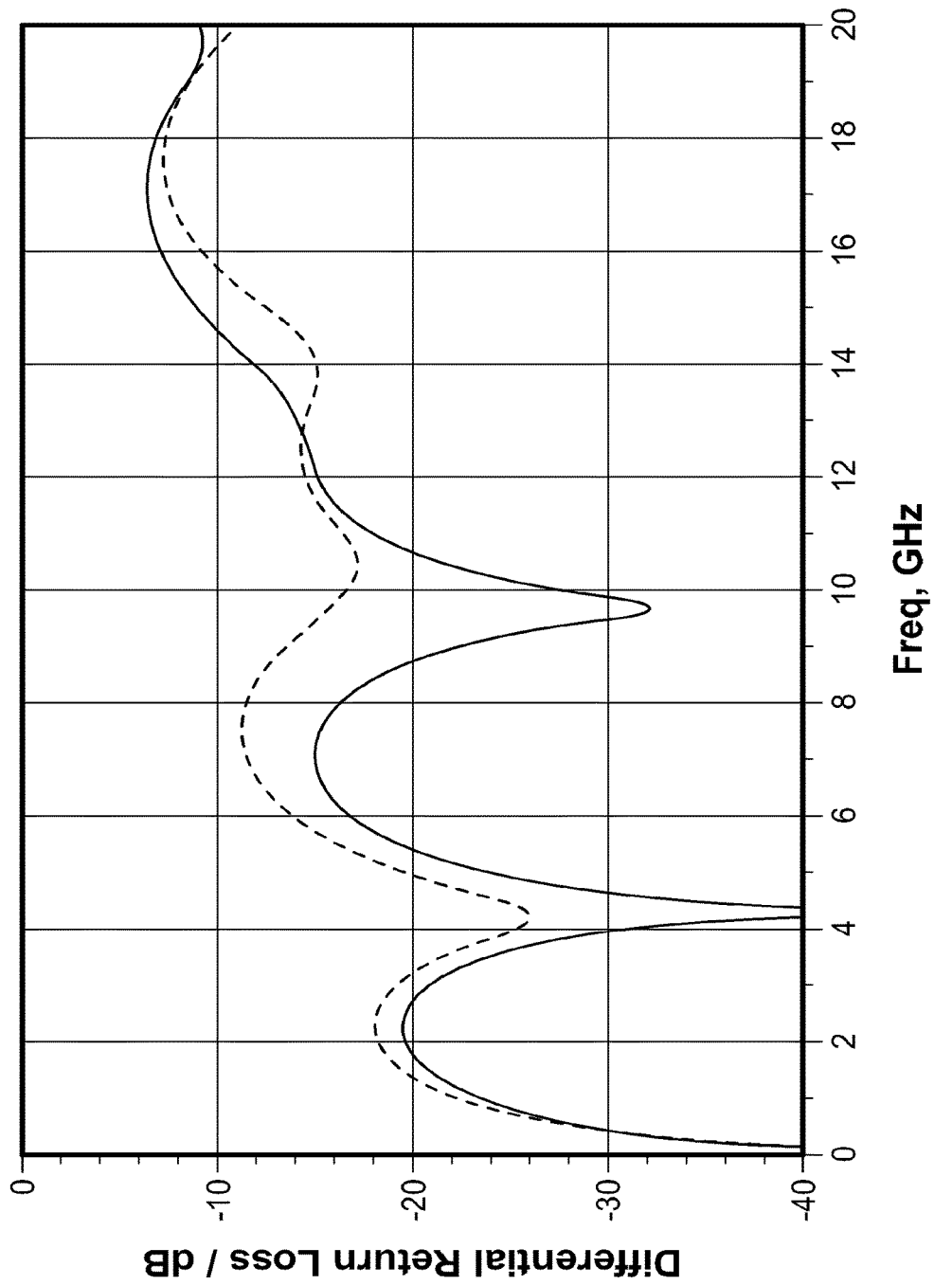
FIG. 6 shows the differential return loss for the E/O engine mounted on a printed circuit board.

FIG. 6 shows the corresponding differential return loss for the case of the E/O engine being connected to a printed circuit board. The significantly improved impedance profile of FIG. 5 is mirrored in an improved return loss, as shown in FIG. 6. Again, curve 601 represents the result with and curve 602 the results without the clearances according to the present invention.

FIGS. 7 to 11 analyze the crosstalk common mode return loss and mode conversion in a comparison with and without the inventive clearances. Dashed lines show the situation with an uninterrupted ground plane layer, whereas the solid lines depict the case with the inventive clearances 126.

As already indicated above, cross-talk is often a critical parameter to consider when selecting an interconnect for a high speed application. Cross-talk can be defined as noise arising from unwanted coupling of nearby signal lines. It occurs when two signals are partially superimposed on each other by inductive and capacitive coupling between the conductors carrying the signals. Cross-talk can result in distortion and degradation of the desired signals. There are two types of crosstalk of concern in high speed systems, near end (NEXT) and far end crosstalk (FEXT). NEXT is the measure of the level of crosstalk at the transmitting end of the signal path, while FEXT is the measure of crosstalk at the receiving end of the signal path.

Figure 7:
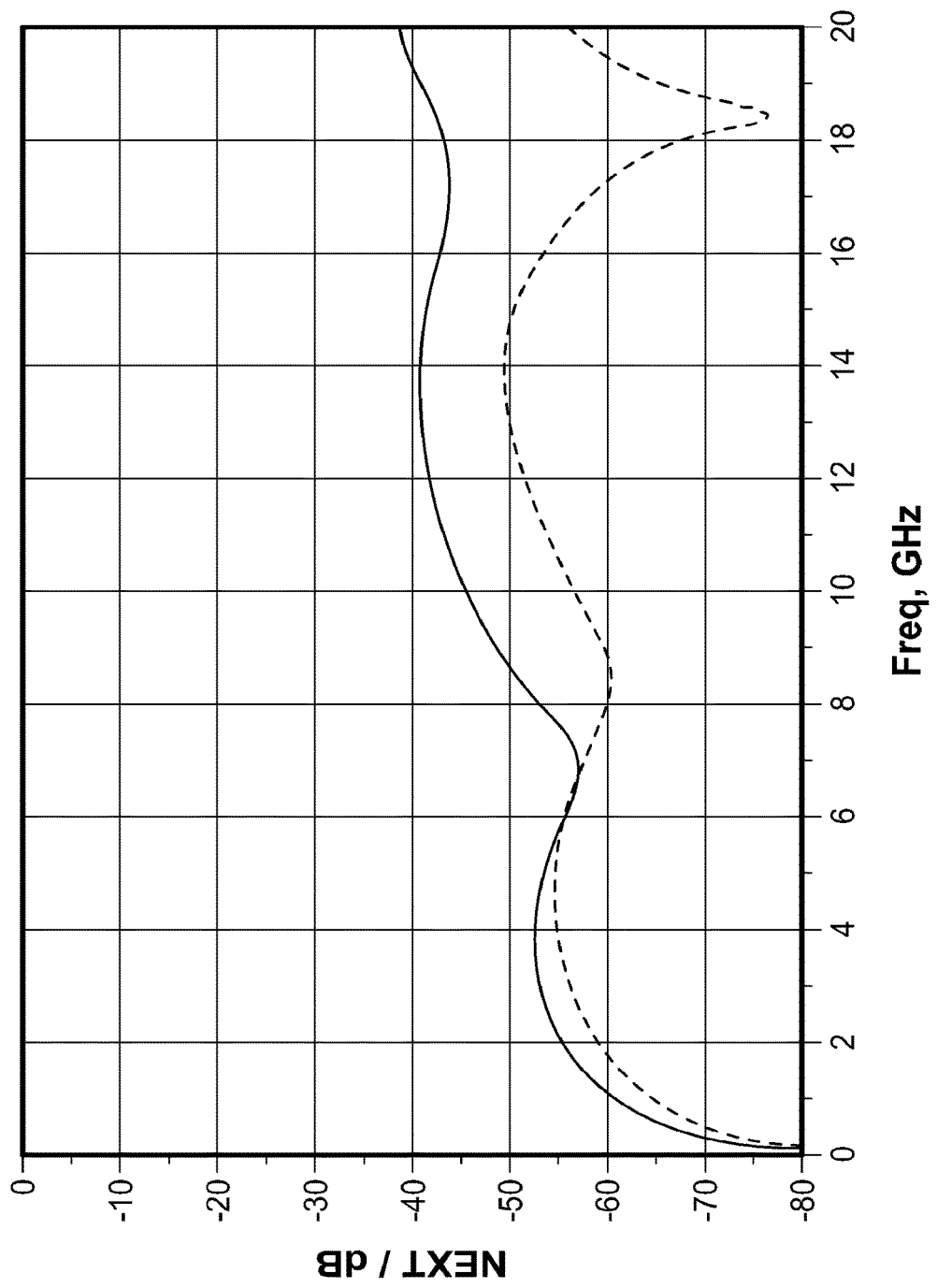
FIG. 7 shows the near-end crosstalk of an E/O engine mounted on a printed circuit board.
Figure 8:
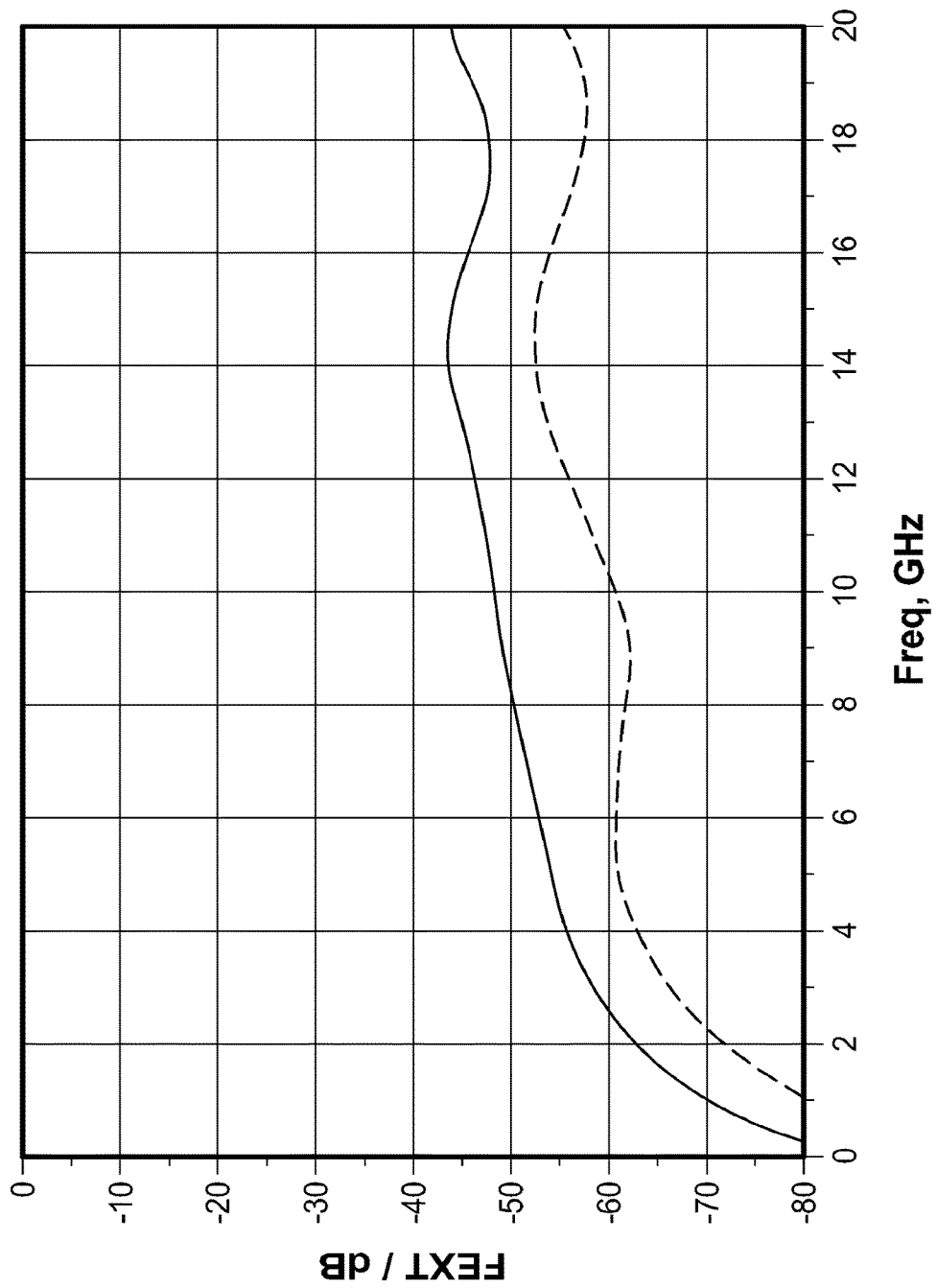
FIG. 8 shows the far-end crosstalk for the E/O engine mounted on a printed circuit board.
Figure 9:
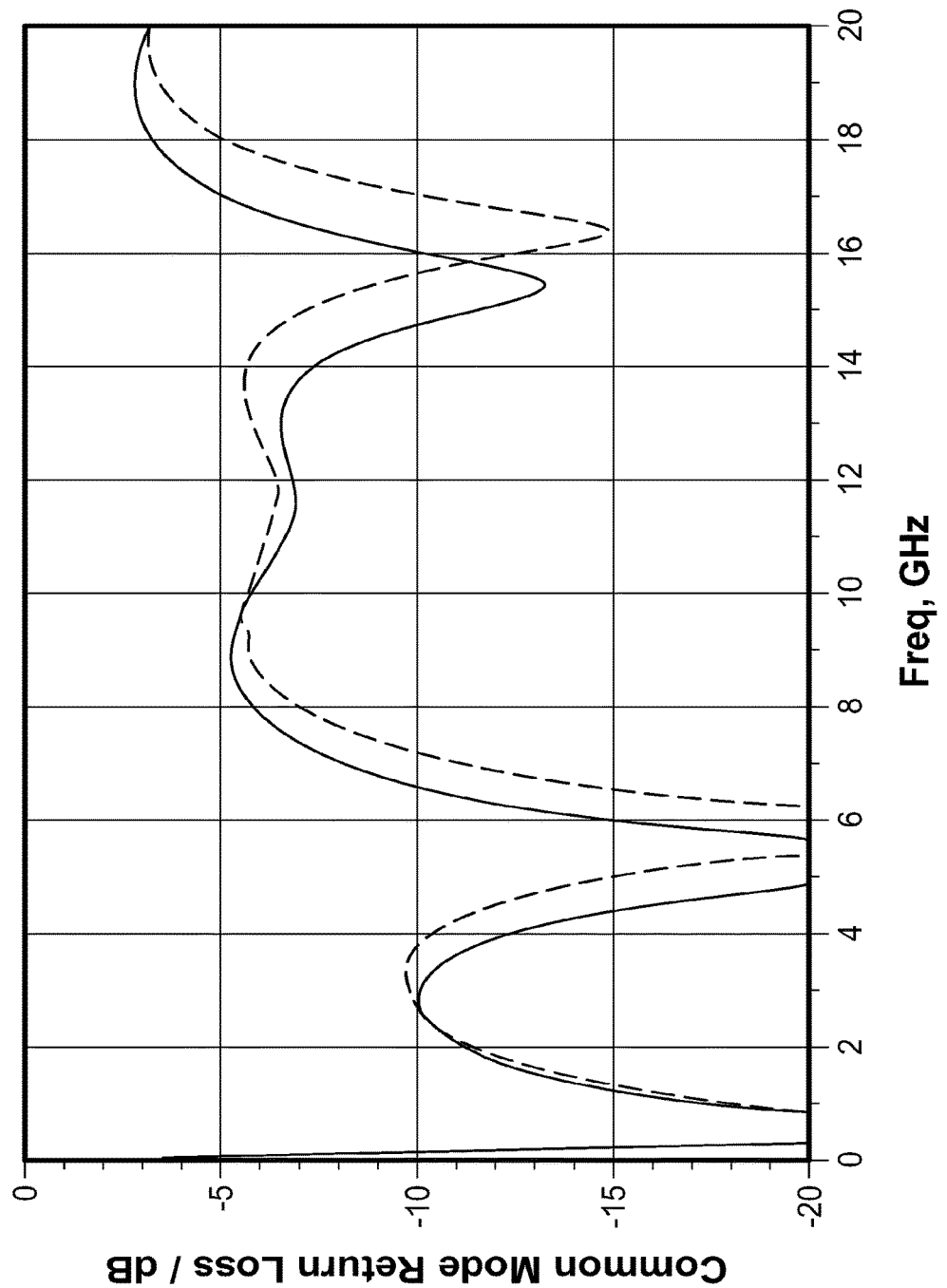
FIG. 9 shows the common mode return loss of the E/O engine mounted on a printed circuit board.

As may be derived from FIGS. 7, 8 and 9, the NEXT, FEXT and CMRL are somewhat degraded due to introduction of the ground plane layer clearance. However, the levels that could be observed are still acceptable for most desired applications. On the other hand, as may be derived from FIGS. 10 and 11, the mode conversion is not significantly degraded by providing the impedance matching clearances 126 according to the present invention.

In particular, FIG. 7 shows the NEXT measured for an E/O engine mounted on a module PCB. Curve 701 corresponds to the solution with and curve 702 to the solution without the IC front end ground clearance implemented. FIG. 8 shows the corresponding FEXT curves 801 and 802.

FIG. 9 depicts the common mode return loss for the case of a module printed circuit board with an E/O engine.

Figure 10:
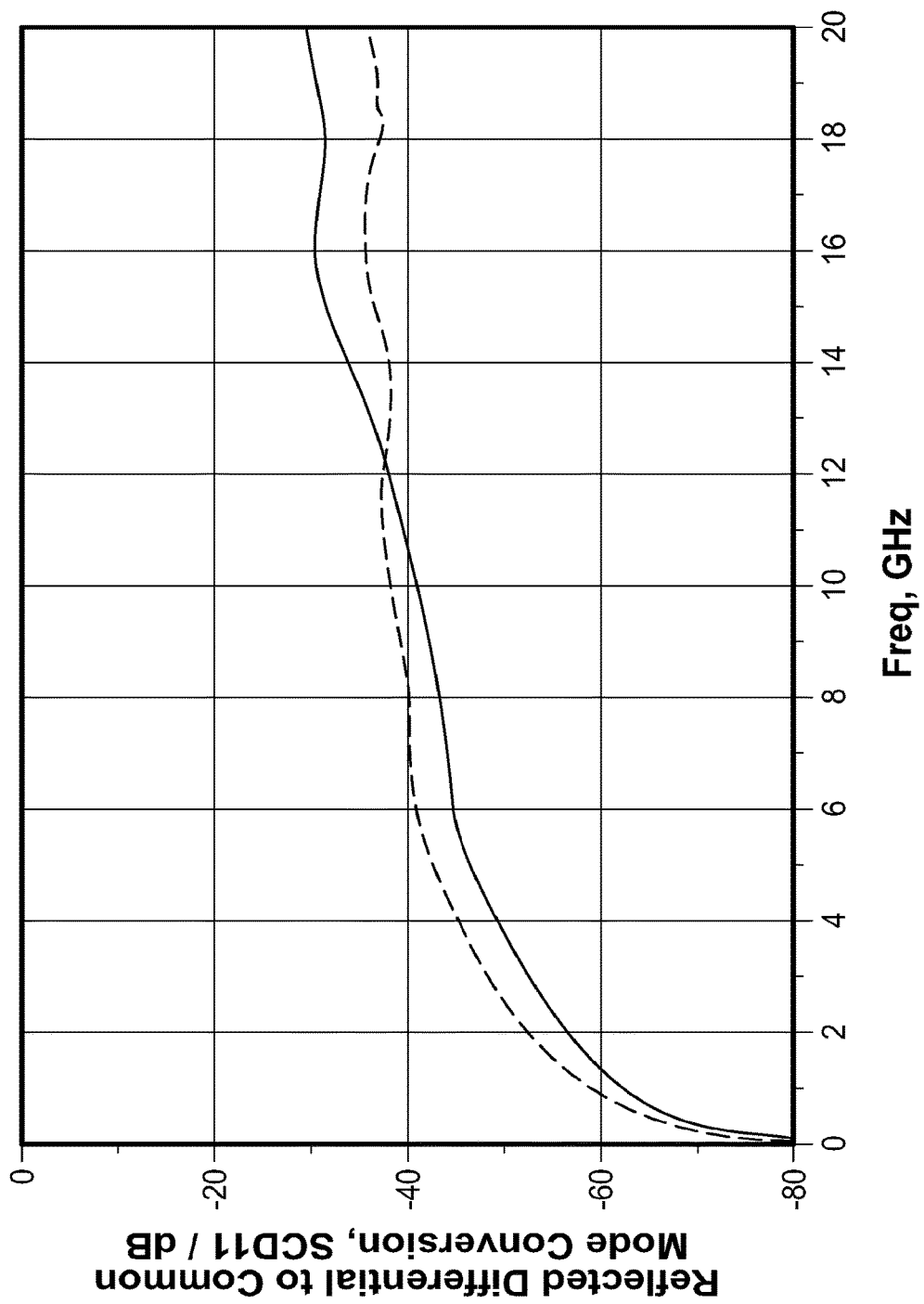
FIG. 10 shows the mode conversion SCD11 for the E/O engine mounted on a printed circuit board.

FIG. 10 shows the SCD11 mode conversion for a module printed circuit board with an E/O engine according to the present invention. In particular, curve 1001 represents the case where the clearance 126 is implemented and curve 1002 shows the situation without clearance.

Figure 11:
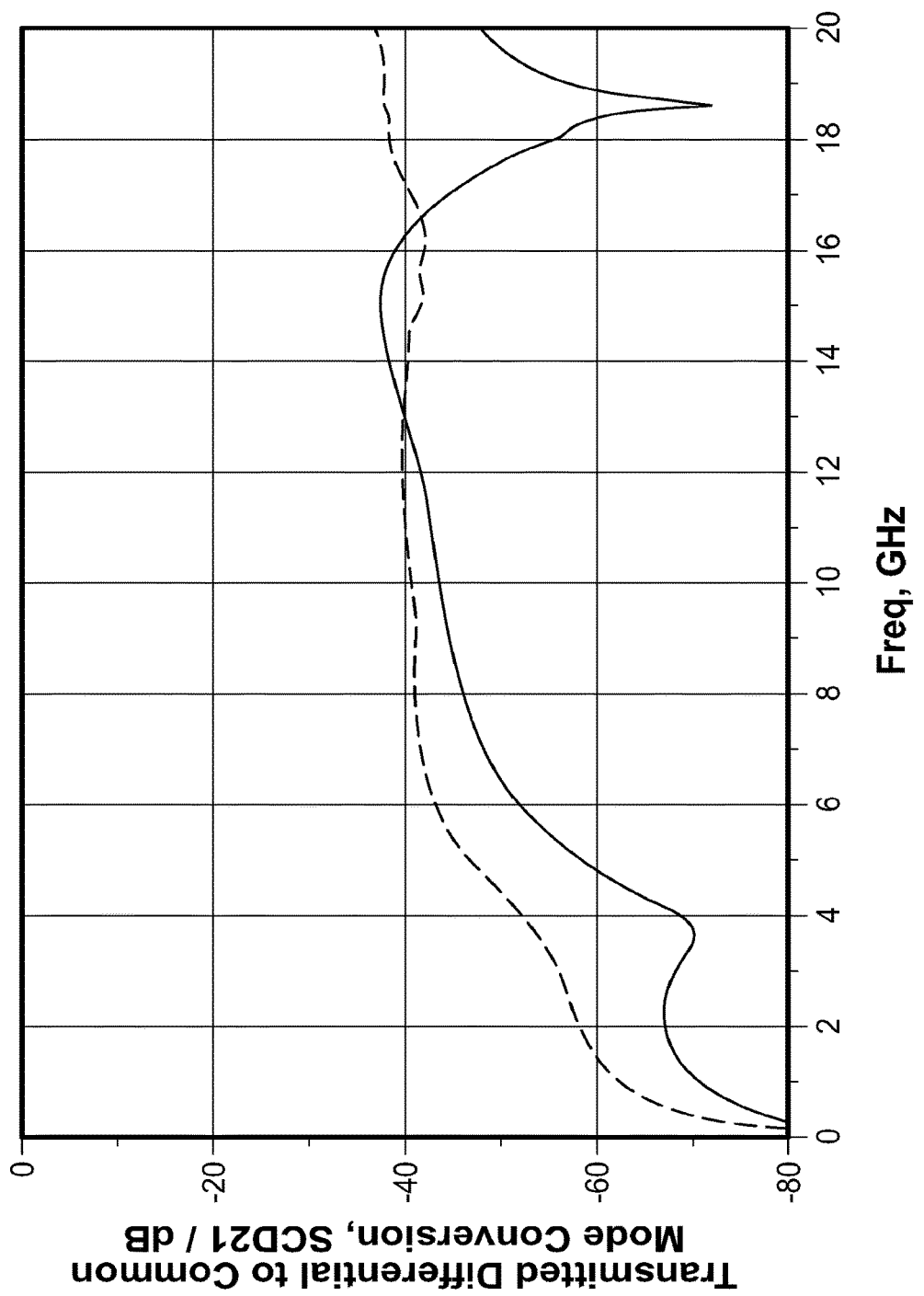
FIG. 11 shows the mode conversion SCD21 for the E/O engine mounted on a printed circuit board.

FIG. 11, finally, shows the mode conversion SCD21 for the case of a module printed circuit board and an E/O engine. The solid line 1101 is correlated with the solution with the ground clearances, whereas curve 1102 represents the case without the ground clearances.

By means of the disclosed embodiments, the driver and TIA front end capacitive impedance can be compensated and the performance thus be improved. Hence, the differential return loss can be improved so that the customer's specifications are met. Thereby, the transmitted signal quality is improved, allowing longer transmission links and a more reliable performance. It could be shown that on the other hand the crosstalk characteristics were not deteriorated unacceptably.

What is claimed is:

1. An interconnect structure comprising:
   an electrically insulating substrate and a plurality of differential signal lead pairs to be coupled between an electronic unit and a frontend contact region;
   a ground plane layer that is electrically insulated from the plurality of differential signal lead pairs,
   wherein each pair of the plurality of differential signal lead pairs has a circuit connecting region configured to electrically contact respective terminals of the electronic unit,
   wherein in a region adjacent to the respective terminals of the electronic unit, the ground plane layer has a plurality of clearances that are each allocated to one pair of the plurality of differential signal lead pairs and separated from a respective neighboring clearance, and wherein a ground plane layer web separates at least two neighboring differential signal lead pairs.

2. The interconnect structure according to claim 1, wherein each of the plurality of clearances has a contour matching a contour of an associated pair of the plurality of differential signal lead pairs.

3. The interconnect structure according to claim 1, wherein the ground plane layer web has a width of at least 30 μm.

4. The interconnect structure according to claim 1, wherein a ratio between a distance of each signal lead of a first signal lead pair towards an adjacent outer boundary of the clearance, and a distance between both leads of the first signal lead pair is approximately ½.

5. The interconnect structure according to claim 1, wherein the clearances extend from the respective terminals of the electronic unit by a distance of at least 700 μm.

6. The interconnect structure according to claim 1, configured to be coupled to an optical receiver unit and an electronic circuit configured to process electric signals generated by the optical receiver unit.

7. The interconnect structure according to claim 6, further comprising at least one pair of transmitter leads configured to connect an optical transmitter unit and the electronic circuit to one another.

8. The interconnect structure according to claim 1, configured to be coupled to an optical transmitter unit and an electronic circuit configured to control the optical transmitter unit.

9. The interconnect structure according to claim 8, further comprising at least one pair of receiver leads configured to connect an optical receiver unit and the electronic circuit to one another.

10. An optoelectronic module comprising:
   at least one electronic unit;
   at least one optical unit;
   an electrical interconnect structure electrically coupling the electronic unit and the optical unit to one another, the electrical interconnect structure comprising:
      an electrically insulating substrate;
      a plurality of differential signal lead pairs electrically coupled to the electronic unit; and
      a ground plane layer electrically insulated from the plurality of differential signal lead pairs, each pair of the plurality of differential signal lead pairs including a circuit connecting region configured to electrically contact respective terminals of the electronic unit;
   wherein in a region adjacent to the respective terminals of the electronic unit and the ground plane layer includes a plurality of clearances that are each allocated to one pair of the plurality of differential signal lead pairs and are separated from a respective neighboring clearance; and
   wherein a ground plane layer web separates at least two neighboring differential signal lead pairs.

11. The optoelectronic module according to claim 10, wherein the electronic unit comprises at least one driver circuit, and the optical unit comprising at least one optical sender.

12. The optoelectronic module according to claim 10, further comprising at least one optical receiver unit and at least one amplifying circuit.

13. The optoelectronic module according to claim 12, wherein the optical receiver unit comprises an array of PIN (positive-intrinsic-negative) photo diodes.

14. The optoelectronic module according to claim 13, wherein the amplifying circuit comprises a transimpedance amplifier (TIA) array.

15. The optoelectronic module according to claim 10, wherein the optical unit comprises an array of vertical cavity surface emitting lasers (VC SEL).

16. An active optical cable assembly comprising:
   at least one optoelectronic module comprising:
      at least one electronic unit;
      at least one optical unit; and
      an electrical interconnect structure coupling the electronic unit and the optical unit to one another, the electrical interconnect structure comprising:
         an electrically insulating substrate;
         a plurality of signal lead pairs electrically coupled to the electronic unit; and
         a ground plane layer electrically insulated from the plurality of signal lead pairs, each pair of the plurality of signal lead pairs including a circuit connecting region configured to electrically contact respective terminals of the electronic unit;
      wherein a region adjacent to the respective terminals of the electronic unit and the ground plane layer includes a plurality of clearances that are each allocated to one pair of the plurality of signal lead pairs and are separated from a respective neighboring clearance; and
      wherein a ground plane layer web separates at least two signal lead pairs;
   an electrical plug configured to interface the optoelectronic module with an external device; and
   an optical conductor optically coupled to the optoelectronic module.

17. The active optical cable assembly according to claim 16, wherein the electrical plug comprises a Quad Small Form-factor Pluggable (QSFP) or a QSFP+ connector.

18. The active optical cable assembly according to claim 16, further comprising a second optoelectronic module optically coupled to the optical conductor.

19. The active optical cable assembly according to claim 18, wherein the second optoelectronic module comprises:
   at least a second electronic unit; and
   at least a second optical unit.

20. The active optical cable assembly according to claim 19, wherein the second optoelectronic module further comprises at least a second electrical interconnect structure.

* * * * *